US006533832B2

(12) United States Patent
Steckenrider et al.

(10) Patent No.: US 6,533,832 B2
(45) Date of Patent: *Mar. 18, 2003

(54) CHEMICAL MECHANICAL POLISHING SLURRY AND METHOD FOR USING SAME

(75) Inventors: J. Scott Steckenrider, Plainfield, IL (US); Brian L. Mueller, Aurora, IL (US)

(73) Assignee: Cabot Microelectronics Corporation, Aurora, IL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/105,060

(22) Filed: Jun. 26, 1998

(65) Prior Publication Data

US 2002/0032987 A1 Mar. 21, 2002

(51) Int. Cl.[7] .................................................. C09G 1/04
(52) U.S. Cl. .............................. 51/308; 51/309; 106/3; 438/692; 438/693
(58) Field of Search ........................ 51/307, 308, 309, 51/293; 106/3; 438/691, 692, 693; 216/89; 252/79.4, 79.1; 510/165, 167, 175, 397

(56) References Cited

U.S. PATENT DOCUMENTS

| 4,086,176 A | 4/1978 | Ericson et al. |
| 4,169,337 A | 10/1979 | Payne |
| 4,462,188 A | 7/1984 | Payne |
| 4,588,421 A | 5/1986 | Payne |
| 4,752,628 A | 6/1988 | Payne |
| 4,867,757 A | 9/1989 | Payne |
| 4,892,612 A | 1/1990 | Huff ............................ 156/636 |
| 4,900,857 A * | 2/1990 | Klett ........................... 556/405 |
| 4,937,275 A * | 6/1990 | Kooijmans et al. .......... 523/404 |
| 5,139,571 A | 8/1992 | Deal et al. ....................... 106/3 |
| 5,176,752 A | 1/1993 | Scheiner ..................... 106/737 |
| 5,230,833 A | 7/1993 | Romberger et al. |
| 5,246,624 A * | 9/1993 | Miller et al. ........... 106/287.34 |
| 5,264,010 A | 11/1993 | Brancaleoni et al. |
| 5,387,361 A | 2/1995 | Kohara et al. ............. 252/79.1 |
| 5,527,423 A | 6/1996 | Neville et al. |
| 5,614,444 A | 3/1997 | Farkas et al. |
| 5,750,440 A | 5/1998 | Vanell et al. ................ 438/692 |
| 5,769,689 A | 6/1998 | Cossaboon et al. ........... 451/41 |
| 5,858,813 A | 1/1999 | Scherber et al. ............ 438/693 |
| 5,860,848 A | 1/1999 | Loncki et al. ................. 451/36 |
| 5,876,266 A | 3/1999 | Miller et al. .................. 451/36 |
| 5,885,334 A | 3/1999 | Suzuki et al. .................. 106/3 |
| 5,904,159 A | 5/1999 | Kato et al. ....................... 134/7 |
| 6,063,306 A * | 5/2000 | Kaufman et al. ........... 438/693 |
| 6,221,118 B1 * | 4/2001 | Yoshida et al. ................ 106/3 |

FOREIGN PATENT DOCUMENTS

| EP | 0 773 270 | 5/1997 |
| GB | 1 449 702 | 9/1976 |
| WO | WO 96/38262 | 12/1995 |
| WO | WO 98/14987 | * 4/1998 |

OTHER PUBLICATIONS

Babu, et al., *Jun. 16–18, 1998 VMIC Conference—1998 IMIC—108/98–0443(c)*, pp. 443–448, Investigation of Cu and Ta Polishing Using Hydrogen Peroxide, Glycine, and a Catalyst (1998) (no month).

* cited by examiner

*Primary Examiner*—Michael Marcheschi

(57) ABSTRACT

An aqueous chemical mechanical polishing slurry useful for polishing the polysilicon layer of a semiconductor wafer comprising an aqueous solution of at least one abrasive, and at least one alcoholamine. The slurry preferably has a pH of from about 9.0 to about 10.5 and it includes an optional buffering agent.

10 Claims, No Drawings

CHEMICAL MECHANICAL POLISHING SLURRY AND METHOD FOR USING SAME

BACKGROUND OF THE INVENTION

1. Field of the Invention

The present invention relates to a chemical mechanical polishing slurry for semiconductor integrated circuit manufacturing and, more particularly, to improved chemical mechanical polishing slurries that are useful for polishing polycrystalline silicon (Poly-Si) and various interconnect layers, metals, and thin-films used in semiconductor integrated circuit manufacturing with especially high selectivity to interlayer dielectric materials.

2. Background of the Related Art

A semiconductor wafer typically includes a substrate, such as a silicon or gallium arsenide wafer, on which a plurality of transistors have been formed. Transistors are chemically and physically connected to the substrate by patterning regions in the substrate and layers on the substrate. The transistors and layers are separated by interlevel dielectrics (ILDs), comprised primarily of some form of silicon oxide ($SiO_2$). The transistors are interconnected through the use of well known multilevel interconnects to form functional circuits. Typical multilevel interconnects are comprised of stacked thin-films consisting of one or more of the following materials: titanium (Ti), titanium nitride (TiN), tantalum (Ta), aluminum-copper (Al—Cu), aluminum-silicon (Al—Si), copper (Cu), tungsten (W), doped polysilicon (Poly-Si), and various combinations thereof. In addition, transistors or groups of transistors are isolated from one another, often through the use of trenches filled with an insulating material such as $SiO_2$, $SiN_4$, or Poly-Si.

The traditional technique for forming interconnects has been improved by the method disclosed in U.S. Pat. No. 4,789,648 to Chow et al. which relates to a method for producing coplanar multilevel metal/insulator films on a substrate. The new technique, which has gained wide interest and produces multilevel interconnects, uses chemical mechanical polishing (CMP) to planarize the surface of the metal layers or thin-films during the various stages of device fabrication.

In general CMP involves the concurrent chemical and mechanical polishing of an overlying first layer to expose the surface of a non-planar second layer on which the first layer is formed. One such process is described in U.S. Pat. No. 4,789,648 to Beyer et al., the specification of which is incorporated herein by reference. Briefly, Beyer et al, discloses a CMP process using a polishing pad and a slurry to remove a first layer at a faster rate than a second layer until the surface of the overlying first layer of material becomes coplanar with the upper surface of the covered second layer. A more detailed explanation of chemical mechanical polishing is found in U.S. Pat. Nos. 4,671,851, 4,910,155 and 4,944,836, the specifications of which are incorporated herein by reference.

The composition of CMP slurries is an important factor in providing an optimal chemical mechanical polishing process. Typical polishing slurries available for CMP processes contain an abrasive such as silica or alumina in an acidic or basic solution. For example, U.S. Pat. No. 4,789,648 to Beyer et al. discloses a slurry formulation including alumina abrasives, an acid such as sulfuric, nitric and acetic acid and deionized water. Similarly, U.S. Pat. No. 5,209,816 to Yu et al. discloses an aqueous slurry including abrasive particles and an anion which controls the rate of removal of silica.

Other CMP polishing slurries are described in U.S. Pat. No. 5,354,490 to Yu et al., U.S. Pat. No. 5,340,370 to Cadien et al., U.S. Pat. No. 5,209,816 to Yu et al., U.S. Pat. Nos. 5,157,876 and 5,137,544 to Medellin, and U.S. Pat. No. 4,956,313 to Cote et al., the specifications of each which are incorporated herein by reference.

Although many of the slurry compositions are suitable for limited purposes, the slurries described above tend to exhibit unacceptable polishing rates and corresponding selectivity levels to insulator materials used in wafer manufacture. In addition, known polishing slurries tend to produce poor film removal traits for the underlying films or produce deleterious film-corrosion which leads to poor manufacturing yields.

Accordingly, a need remains for new and improved polishing slurries and processes having high selectivity to the insulator media surrounding the trenches or interconnects, e.g., silica, spin-on-glass, and low k dielectric material which are not hazardous or corrosive. A further need remains for a single slurry which is capable of providing both high and uniform removal rates of the first layer and high selectivities to the insulator films.

SUMMARY OF THE INVENTION

This invention is a chemical mechanical polishing slurry that is especially useful for polishing semi-conductive layers of a semiconductor integrated circuit at high rates.

This invention is also a chemical mechanical polishing slurry that exhibits a high selectivity towards polishing a dielectric layer in comparison to an interlevel dielectric layer (ILD) layer of an IC circuit.

Furthermore, this invention is a chemical mechanical polishing slurry that has good storage stability.

This invention is also a method for using a chemical mechanical polishing slurry to polish at least one layer of a substrate such as an integrated circuit.

In one embodiment, this invention is an aqueous chemical mechanical polishing composition for polishing a substrate containing a metal or silicon layer or thin film. The aqueous chemical mechanical polishing slurry includes at least one abrasive and at least one alcoholamine wherein the alcoholamine is preferably a tertiary alcoholamine.

In another embodiment, this invention is an aqueous chemical mechanical polishing slurry. The aqueous chemical mechanical polishing slurry comprises from about 0.5 to about 15 weight percent fumed silica, from about 50ppm to about 2.0 weight percent 2-dimethylamino-2-methyl-1-propanol, and from about 0.01 to about 1.0 weight percent ammonium bicarbonate buffering agent. The aqueous chemical polishing slurry preferably has a pH of from about 9.0 to about 10.5 and exhibits a polysilicon to PETEOS polishing selectivity of at least 500.

DESCRIPTION OF THE CURRENT EMBODIMENT

The present invention is directed to chemical mechanical polishing slurries for polishing conductive and semi-conductive layers and thin-films with high selectivity to ILD materials. The polishing slurry is an aqueous medium including at least one abrasive and at least one alcoholamine. The slurry may also include optional additives such as a buffering agent.

The first component of the slurry of this invention is at least one abrasive. The abrasive is typically a metal oxide abrasive. The metal oxide abrasive may be selected from the group including alumina, titania, zirconia, germania, silica, ceria and mixtures thereof. The CMP slurry of this invention may include from about 0.1 to about 55 weight percent or more of an abrasive. It is more preferred, however, that the CMP slurry of this invention includes from about 0.5 to about 15 weight percent abrasive and most preferably, 0.5 to about 3.0 wt % of an abrasive.

The metal oxide abrasive may be produced by any techniques known to those skilled in the art. Metal oxide abrasives can be produced using any high temperature process such as sol-gel, hydrothermal or, plasma process, or by processes for manufacturing fumed or precipitated metal oxides. Preferably, the metal oxide is a fumed or precipitated abrasive and, more preferably it is a fumed abrasive such as fumed silica or fumed alumina. For example, the production of fumed metal oxides is a well-known process which involves the hydrolysis of suitable feedstock vapor (such as aluminum chloride for an alumina abrasive) in a flame of hydrogen and oxygen. Molten particles of roughly spherical shapes are formed in the combustion process, the diameters of which are varied through process parameters. These molten spheres of alumina or similar oxide, typically referred to as primary particles, fuse with one another by undergoing collisions at their contact points to form branched, three dimensional chain-like aggregates. The force necessary to break aggregates is considerable. During cooling and collecting, the aggregates undergo further collision that may result in some mechanical entanglement to form agglomerates. Agglomerates are thought to be loosely held together by van der Waals forces and can be reversed, i.e., de-agglomerated, by proper dispersion in a suitable media.

Precipitated abrasives may be manufactured by conventional techniques such as by coagulation of the desired particles from an aqueous medium under the influence of high salt concentrations, acids or other coagulants. The particles are filtered, washed, dried and separated from residues of other reaction products by conventional techniques known to those skilled in the art.

A preferred metal oxide will have a surface area, as calculated from the method of S. Brunauer, P. H. Emmet, and I. Teller, J. Am. Chemical Society, Volume 60, Page 309 (1938) and commonly referred to as BET, ranging from about 5 $m^2/g$ to about 430 $m^2/g$ and preferably from about 30$m^2/g$ to about 170 $m^2/g$. Due to stringent purity requirements in the IC industry the preferred metal oxide should be of a high purity. High purity means that the total impurity content, from sources such as raw material impurities and trace processing contaminants, is typically less than 1% and preferably less than 0.01% (i.e., 100 ppm).

The metal oxide abrasive useful in the dispersion of this invention may consist of metal oxide aggregates or individual single sphere particles. The term "particle" as it is used herein refers to both aggregates of more than one primary particle and to single particles.

It is preferred that the metal oxide abrasive consists of metal oxide particles having a size distribution less than about 1.0 micron, a mean particle diameter less than about 0.4 micron and a force sufficient to repel and overcome the van der Waals forces between abrasive aggregates themselves. Such metal oxide abrasive has been found to be effective in minimizing or avoiding scratching, pit marks, divots and other surface imperfections during polishing. The particle size distribution in the present invention may be determined utilizing known techniques such as transmission electron microscopy (TEM). The mean particle diameter refers to the average equivalent spherical diameter when using TEM image analysis, i.e., based on the cross-sectional area of the particle. By force is meant that either the surface potential or the hydration force of the metal oxide particles must be sufficient to repel and overcome the van der Waals attractive forces between the particles.

In another preferred embodiment, the metal oxide abrasive may consist of discrete, individual metal oxide particles having a primary particle diameter less than 0.4 micron (400 nm) and a surface area ranging from about 10 $m^2/g$ to about 250 $m^2/g$.

Preferably, the metal oxide abrasive is incorporated into the aqueous medium of the polishing slurry as a concentrated aqueous dispersion of metal oxides. The concentrated aqueous dispersion of metal oxides comprising from about 3% to about 45% solids, and preferably between 10% and 20% solids. The aqueous dispersion of metal oxides may be produced utilizing conventional techniques, such as slowly adding the metal oxide abrasive to an appropriate media, for example, deionized water, to form a colloidal dispersion. The dispersion is typically completed by subjecting it to high shear mixing conditions known to those skilled in the art. The pH of the slurry may be adjusted away from the isoelectric point to maximize colloidal stability.

A most preferred abrasive of this invention is fumed silica.

The chemical mechanical polishing slurry of this invention includes at least one alcoholamine. It has been found that the addition of an alcoholamine to the polishing slurry enhances the polishing rate of the polysilicon compound in comparison to the underlying ILD layer. Any alcoholamines may be used in the compositions of this invention. Examples of useful alcoholamines include ethanol amines, propanol amines, primary alcoholamines, secondary alcoholamines, tertiary alcoholamines and so forth. A most preferred type of alcoholamines useful in the compositions of this invention are tertiary alcoholamines. Examples of useful tertiary alcoholamines include triethynol amine, dialkylethanol amine, alkyl diethanol amine and the like. It is preferred that the tertiary alcoholamine include two methyl groups and one isopropyl group. A most preferred tertiary alcoholamine is 2-dimethylamino-2-methyl-1-propanol.

The alcoholamine is present in the compositions of this invention in the amount that improves the polysilicon polishing rate. The amount of alcoholamine used in the compositions of this invention will vary from about 50 ppm to about 2 wt % or more. More preferably, the alcoholamine should be present in the composition of this invention in an amount ranging from about 500 ppm to about 1.0 wt %.

A buffering agent may be added to the compositions of this invention as an optional ingredient. The buffer functions in the compositions of this invention to make the slurries more resistant in pH change. In addition, the polysilicon rate is slightly enhanced by adding a buffer to the compositions of this invention. Any buffer which possesses an acid/conjugate base with a pKa close to the desired composition pH is preferred as a composition buffer. The actual pH can be approximated with the equation:

$$pH=pKa++log[conjugate\ base]/[acid]$$

which may be used in the compositions of this invention. It is preferred however that the buffer does not contain metallic ions. Especially useful buffers include carbonate and bicarbonate buffers such as ammonium bicarbonate.

The buffer, if used, should be present in the compositions of this invention in amounts ranging from about 0.01 to about 1.0 wt %. It is most preferred that the buffer is present in the compositions of this invention in an amount ranging from about 0.01 to about 0.15 wt %.

Other well known polishing slurry additives may be incorporated into the chemical mechanical polishing slurry of this invention. Useful optional additives include surfactants, stabilizers, complexing agents, film forming agents and the like compositions. An example of one class of optional additives are inorganic acids and/or salts thereof which may be added to the polishing slurry to further improve or enhance the polishing rate of the barrier layers in the wafer, such as titanium and tantalum. Useful inorganic additives include sulfuric acid, phosphoric acid, nitric acid, HF acid, ammonium fluoride, ammonium salts, potassium salts, sodium salts or other cationic salts of sulfates, phosphates and fluorides.

It is desirable to maintain the pH of the CMP slurry of this invention within a range of from about 7.0 to about 12.0, more preferably within a range of from about 8.0 to about 12.0, and most preferably within a range of from about 9.0 to about 10.5 in order to facilitate control of the CMP process. Substrate polishing quality problems are encountered when the pH of the CMP slurry of this invention is too low, e.g., less than about 8. The pH of the CMP slurry of this invention may be adjusted using any known acids or bases. However, the use of an acid or base that contains no metal ions, such as ammonium hydroxide or nitric, phosphoric, sulfuric, or organic acids are preferred to avoid introducing undesirable metal components into the CMP slurry of this invention.

The CMP slurry of this invention may be used to polish any type of conductive layer including, for example, tungsten, aluminum, copper, titanium, tantalum, and mixtures thereof. However, the chemical mechanical polishing slurry of this invention has been found to be most useful for polishing conductive and semi-conductive layers of integrated circuit wafers including, but not limited to titanium nitride, tantalum nitride, and polysilicon layers. The polysilicon layers can include both epitaxial silicon and polycrystalline silicon.

The chemical mechanical polishing slurries of this invention have high polysilicon (Poly-Si) polishing rate. In addition, the chemical mechanical polishing slurries of this invention exhibits desirable low polishing rates towards the dielectric (PETEOS) insulating layer. As a result, the polishing slurries of this invention exhibit [Poly-Si]/[PETEOS] polishing selectivities of at least greater than 100, and preferably greater than about 500.

The CMP slurry of this invention may be produced using conventional techniques known to those skilled in the art. Typically, the non-abrasive components such as the alcoholamine, are mixed into an aqueous medium, such as deionized or distilled water, at pre-determined concentrations under low shear conditions until such components are completely dissolved in the medium. A concentrated dispersion of the metal oxide abrasive, such as fumed silica, is added to the medium and diluted to the desired loading level of abrasive in the final CMP slurry prior to slurry use.

The silica and the alcoholamines used in the compositions of this invention form a stable slurry. Therefore, the CMP slurries of the present invention will typically be supplied as one package system (abrasive and alcoholamine in a stable aqueous medium).

In a typical chemical mechanical polishing process that uses the CMP slurries of this invention, the substrate or wafer to be polished will be placed in direct contact with a rotating polishing pad. A carrier applies pressure against the backside of the substrate. During the polishing process, the pad and table are rotated while a downward force is maintained against the substrate back. A chemical mechanical polishing slurry of this invention is applied to the pad during polishing. The slurry initiates the polishing process by reacting with the film being polished either mechanically, chemically, or both. The polishing process is facilitated by the rotational movement of the pad relative to the substrate as slurry is provided to the wafer/pad interface. Polishing is continued in this manner until a least a portion of the desired film on the insulator is removed.

EXAMPLE 1

This Example investigates the effect of adding a tertiary alcoholamine to a conventional low-metals silica-based polishing slurry on polishing rates and selectivity to PETEOS.

A base polishing slurry including 2 wt % of L90 fumed silica having an average surface area of about 90 $m^2/g$, manufactured by Cabot Corporation and water adjusted to a pH of 10.5 using ammonium hydroxide ($NH_4OH$) was prepared by admixing the ingredients. A second polishing slurry was made including 2 wt % of L90 fumed silica manufactured by Cabot Corporation and water adjusted to a pH of 10.5 using 0.15 wt% of 2-dimethylamino-2-methyl-1-propanol which is a tertiary alcoholamine.

Both polishing slurries were used to polish Poly-Si and PETEOS 8" wafers using an IPEC 472 polisher loaded with a perforated IC1000/Suba IV pad manufactured by Rodel. The polishing conditions used were a 5.5 psi down-force, a 1.8 psi back-pressure, a 30 rpm platen speed, a 24 rpm carrier speed and a 140 ml/min slurry flow rate. The polishing results are reported in Table I below.

TABLE I

| Run | wt % Silica | Additive | pH | Poly-Si Rate Å/min | PETEOS Rate Å/min | Poly-Si/PETEOS Selectivity |
|---|---|---|---|---|---|---|
| 1 | 2 | $NH_4OH$ | 10.5 | 1868.4 | 48.0 | 38.92 |
| 2 | 2 | T-AMINE | 10.5 | 3003.4 | 9.36 | 320.9 |

The polishing results indicate that the Poly-Si polishing rate is enhanced and the PETEOS polishing rate is reduced by using a slurry including a tertiary alcoholamine.

EXAMPLE 2

This Example investigates the effect of amount and type of amine added to a conventional low-metals silica-based polishing slurry on polishing rates and selectivity to PETEOS.

A base polishing slurry was prepared including 2 wt % of L90 fumed silica having an average surface area of about 90 $m^2/g$, manufactured by Cabot Corporation and water. Varying amounts and types of alcoholamines or ammonium salts were added to the slurry as set forth in Table II, below. The alcoholamines and ammonium salts combined with the base slurry included ammonium salts tetramethylammonium hydroxide ("TMAH"), methltertiarybutylammonium hydroxide ("MTBAH"), and the alcoholamines 2-amino-2-methyl1-proponol ("AMP-95") and 2-dimethylamino-2-methyl-1-propanol ("T-AMINE").

The polishing slurries were used to polish both Poly-Si and PETEOS 8" wafers using an IPEC 472 polisher loaded with a perforated IC1000/Suba IV pad manufactured by Rodel. The polishing conditions used were a 5.5 psi down-force, a 1.8 psi back-pressure, a 30 rpm platen speed, a 24 rpm carrier speed and a 140 ml/min slurry flow rate.

The polishing results are reported in Table II below.

TABLE II

| Run | % solids | pH | Additive type | Additive ppm | Poly-Si Rate Å/min | PETEOS Rate Å/min | Selectivity Poly-Si/PETEOS |
|---|---|---|---|---|---|---|---|
| 3 | 2 | 10.5 | TMAH | 430 | 2968 | 10.16 | 292 |
| 4 | 2 | 10.5 | MTBAH | 875 | 3085 | 2.62 | 1177 |
| 5 | 2 | 10.3 | AMP-95 | 1500 | 2367 | 2.88 | 822 |
| 6 | 2 | 10.5 | T-AMINE | 1500 | 2995 | 2.67 | 1122 |
| 7 | 2 | 10.6 | T-AMINE | 1500 | 2909 | 0.80 | 3636 |
| 8 | 2 | 10.0 | T-AMINE | 730 | 2716 | 3.17 | 857 |
| 9 | 2 | 10.0 | T-AMINE | 500 | 2218 | 1.25 | 1774 |
| 10 | 2 | 10.5 | T-AMINE | 1500 | 3232 | 2.50 | 1293 |
| 11 | 2 | 10.6 | T-AMINE | 5000 | 2987 | 4.32 | 692 |
| 12 | 2 | 11.2 | T-AMINE | 15000 | 2236 | 2.25 | 994 |
| 13 | 2 | 11.3 | T-AMINE | 25000 | 2056 | 2.35 | 875 |

The polishing results indicate that a silica slurry including alcoholamines i.e., (runs 5–13), exhibit a superior [Poly-Si]/[PETEOS] polishing selectivity in comparison to the same silica slurry including similar amounts of ammonium salts.

EXAMPLE 3

This Example investigates the effect of adding buffers to a polishing slurry including a fumed silica abrasive and at least one tertiary amine on polishing rates and defectivity.

A base polishing slurry including 2 wt % of L90 fumed silica having an average surface area of about 90 m²/g, manfactured by Cabot Corporation and water was prepared by admixing the ingredients. Varying amounts of ammonium bicarbonate and the tertiary alcoholamine, 2-dimethylamino-2-methyl-1-propanol, were added to the slurry in the amounts set forth in Table III below.

The polishing slurries were used to polish both Poly-Si and PETEOS 8" wafers using an IPEC 472 polisher loaded with a perforated IC 1000/Suba IV pad. The polishing conditions used were a 5.5 psi down-force, a 1.8 psi back-pressure, a 30 rpm platen speed, a 24 rpm carrier and a 140 ml/min slurry flow rate.

The polishing results are reported in Table III, below.

TABLE III

| Run | T-Amine wt % | Buffer ppm | Poly Si Rates | PETEOS Rate | Poly-Si/PETEOS Selectivity |
|---|---|---|---|---|---|
| 1 | 0.15 | 0 | 3197.83 | | |
| 2 | 0.15 | 0 | 3231.71 | 2.5 | 1293 |
| 3 | 0.15 | 700 | 3526.36 | | |
| 4 | 0.15 | 700 | 3564.93 | 5.12 | 696 |
| 5 | 0.5 | 0 | 2960.8 | | |
| 6 | 0.5 | 0 | 2987.39 | 4.32 | 691 |
| 7 | 0.5 | 700 | 3474.3 | | |
| 8 | 0.5 | 700 | 3467.33 | 4.28 | 810 |
| 9 | 1.5 | 0 | 2213.34 | | |
| 10 | 1.5 | 0 | 2235.9 | 2.25 | 994 |
| 11 | 1.5 | 700 | 2367.87 | | |
| 12 | 1.5 | 700 | 2344.33 | 4.25 | 552 |
| 13 | 2.5 | 0 | 2055.3 | | |
| 14 | 2.5 | 0 | 2055.73 | 2.35 | 875 |
| | | Went into pad wet for 30 min delay | | | |
| 15 | 2.5 | 700 | 2135.48 | | |
| 16 | 2.5 | 700 | 2131.76 | 3.94 | 541 |
| 17 | 0.15 | 0 | 3218.72 | 2.79 | 1154 |

The polishing results show that the addition of a buffering agent to the alcoholamine containing slurries of this invention enhances the slurry Poly-Si polishing rate without significantly altering the Poly-Si/PETEOS polishing selectivity.

While the present invention has been described by means of specific embodiments, it will be understood that modifications may be made without departing from the spirit of the invention. The scope of the invention is not to be considered as limited by the description of the invention set forth in the specification and examples, but rather as defined by the following claims.

What we claim is:

1. An aqueous chemical mechanical polishing slurry for polishing a substrate containing a metal or silicon layer or thin film, comprising:
   from about 0.01 to about 3.0 weight percent fumed silica; and
   at least one alcoholamine selected from the group consisting of, dialkylethanol amine, alkyl diethanol amine, and 2-dimethylamino-2-methyl-1-propanol.

2. The aqueous chemical mechanical polishing slurry of claim 1 wherein the slurry has a polysilicon to insulating layer polishing selectivity greater than about 100.

3. The aqueous chemical mechanical polishing slurry of claim 1 wherein the slurry has a pH of from about 9 to about 10.5.

4. The aqueous chemical mechanical polishing slurry of claim 1 wherein the alcoholamine is 2-dimethylamino-2-methyl-1-propanol.

5. The aqueous chemical mechanical polishing slurry of claim 1, wherein the fumed silica has a particle size distribution less than 1000 nm and a mean particle diameter less than about 400 nm.

6. The aqueous chemical mechanical composition of claim 1 including a bicarbonate buffering agent.

7. The aqueous chemical mechanical polishing slurry of claim 6, wherein the buffering agent in present in the slurry in an amount ranging from about 0.01 to about 1.0 weight percent.

8. The aqueous chemical mechanical polishing slurry of claim 1 having a polysilicon to PETEOS polishing selectivity of at least 500.

9. An aqueous chemical mechanical polishing composition for polishing a substrate containing a metal or silicon layer or thin film, comprising:
   about 0.5 to about 3 weight percent fumed silica; and
   at least one alcoholamine selected from dialkylethanol amine, alkyl diethanol amine, and 2-dimethylamino-2-methyl-1-propanol.

10. The polishing composition of claim 9 wherein the alcoholamine is 2-dimethylamino-2-methyl-1-propanol.

* * * * *